United States Patent [19]
Diepers et al.

[11] 3,940,848
[45] Mar. 2, 1976

[54] METHOD FOR THE MANUFACTURE OF TUBULAR CONDUCTORS

[75] Inventors: Heinrich Diepers, Erlangen-Bruck; Otto Schmidt, Erlangen, both of Germany

[73] Assignee: Siemens Aktiengesellschaft, Munich, Germany

[22] Filed: Jan. 28, 1974

[21] Appl. No.: 437,227

[30] Foreign Application Priority Data
Feb. 15, 1973 Germany............................ 2307461

[52] U.S. Cl............................ 29/599; 174/126 CP
[51] Int. Cl.²......................................... H01V 11/00
[58] Field of Search............ 29/599, 527.2, DIG. 12, 29/527.4, 527.7, DIG. 32; 174/126 CP, DIG. 6

[56] References Cited
UNITED STATES PATENTS

| | | |
|---|---|---|
| 2,828,251 | 3/1958 | Sibert et al. ......................... 204/39 |
| 3,444,058 | 5/1969 | Mellors et al. ..................... 204/39 X |
| 3,691,031 | 9/1972 | Lugscheider......................... 204/39 |
| 3,777,368 | 12/1973 | Pfister et al........................... 29/599 |
| 3,783,503 | 1/1974 | Diepers et al........................ 29/599 |
| 3,814,673 | 6/1974 | Cook ................................... 204/39 |

*Primary Examiner*—C. W. Lanham
*Assistant Examiner*—V. K. Rising
*Attorney, Agent, or Firm*—Kenyon & Kenyon Reilly Carr & Chapin

[57] ABSTRACT

A method for manufacturing tubular conductors which consist of a niobium layer and a layer of normal electrically conducting metal in which a copper body of rectangular cross section is covered with niobium on one wide and two narrow sides by means of fusion electrolysis and the resulting body then rolled to form a ribbon which is then bent to form a tube with the niobium flanges at the two edges of the ribbon abuting and welded together by electron beam welding. Tubular conductors made according to the method of the present invention are particularly suited for use as superconducting cables.

10 Claims, 5 Drawing Figures

METHOD FOR THE MANUFACTURE OF TUBULAR CONDUCTORS

BACKGROUND OF THE INVENTION

This invention relates to the formation of tubular conductors which consist of a niobium layer and a layer of normal conducting metal in general, and more particularly to an improved method of forming such tubular conductors.

A method for manufacturing such tubular conductors is disclosed in U.S. Pat. No. 3,777,368 issued Dec. 11, 1973 and assigned to the same assignee as the present invention. In the method disclosed therein, a ribbon consisting of layers of niobium and a normally conducting metal and which has at its edges a niobium flange is first fabricated. The ribbon is then bent to form a tube in such a manner that the niobium flanges at both edges of the ribbons abut and subsequently the niobium flanges are joined together, preferably by electron beam welding. Specifically, as disclosed in the above referenced patent, the fabrication of the ribbon consisting of the two layers is accomplished by first welding, to the two edges of a ribbon shaped niobium foil, niobium flanges, using electron beam welding to form a U-shaped niobium cross section. The empty space of the U-shaped cross section is then at least partially filled with a normal conducting metal. After this, the normally conducting metal is joined to the niobium ribbon and niobium flanges by the application of heat. An alternate method of fabrication also disclosed in the above reference patent comprises first joining the lateral edges of a copper ribbon to niobium flanges using diffusion and then applying a niobium layer on at least one side of the ribbon consisting of the niobium flanges and copper ribbons. As disclosed, the niobium layer can be applied by means of fusion electrolysis.

Although the methods disclosed in the above referenced patent are satisfactory, they require many steps and are not particularly simple. Thus, it is the object of this invention to provide a simpler method of forming tubular conductors of this nature.

SUMMARY OF THE INVENTION

The present invention simplifies the process of forming such tubular conductors by eliminating some of the steps previously required. In carrying out the invention, a copper body of rectangular cross section is first plated with niobium on one wide side and two narrow sides using fusion electrolysis, after which the body so formed is rolled to form a ribbon. As disclosed, this forming will preferably be done by cold rolling since niobium would quickly oxidize in air at elevated temperature. It is advantageous that the rolling to the final thickness be done in several passes. The ribbon resulting after rolling will be a ribbon having layers of copper and niobium with niobium flanges on each side. The ribbon is then bent to form a tube in a manner such as that disclosed in the above referenced patent with the niobium flanges electron beam welded together.

For plating the copper body using fusion electrolysis, a trough-shaped anode is employed which surrounds the sides of the copper body which must be covered in order to only plate those sides where plating is desired. In a second disclosed process, two copper bodies are placed side-by-side and the whole arrangement plated, after which the two bodies are separated, thereby providing two layered bodies with flanges which can then be rolled to form the ribbons used in making the tubular conductor.

DETAILED DESCRIPTION OF THE PREFERRED EMBODIMENT

As indicated above, the first step of the present invention comprises covering a copper body on three sides with niobium using fusion electrolysis. For carrying out this process, the method described in the article by Mellors and Senderoff in the "Journal of the Electrochemical Society", vol. 112 (1965) p. 266 to 272 can advantageously be used. A particularly well suited electrolyte is a eutectic mixture of sodium fluoride, potassium fluoride and lithium fluoride, in which potassium heptafluoroniobate ($K_2NbF_7$) is dissolved. A preferred electrolyte will consist of 16.2 % by weight $K_2NbF_7$, 26.2 % by weight LiF, 10.4 % by weight NaF and 47.2 % by weight KF.

Figure 1:
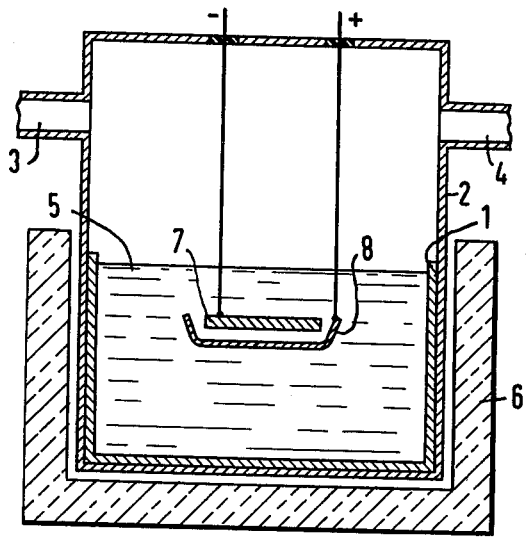
FIG. 1 is a schematic illustration of the plating of the copper body using a trough-shaped electrode and employing a fusion electrolysis method.

The components of the electrolyte in the above mentioned proportions, are then placed in a tank 1, such as that shown on FIG. 1, which will preferably be made of nickel. The tank 1, as illustrated, is placed in the lower part of a coating chamber 2, which will preferably be made of alloy steel. The coating chamber after the electrolyte is placed therein, is evacuated via the nozzles 3 and 4 and is then flushed with an inert gas such as argon. Subsequently, the electrolyte 5 is heated to a temperature of approximately 740° C using an electric resistance furnace 6, which surrounds the lower part of the coating chamber 2. This will result in the electrolyte being melted. The copper body 7, which is to be plated and which has a rectangular cross section and an anode 8 which may, for example, consist of a niobium sheet, are then immersed in the melted electrolyte in a configuration such as that illustrated on FIG. 1. Prior to immersion of the copper body 7 and the anode 8, a preliminary precipitation such as that described in detail in German Offenlegungsschrift No. 2,114,555 can be carried out using an auxiliary electrode.

As illustrated, the anode 8 is of a trough-shaped design and will thereby result in niobium being deposited, for the most part, only on the wide side and the two narrow sides which are enclosed by the anode. Should small amounts of niobium also be deposited on the other wide side of the copper body, this niobium can be removed after the end of the plating process by grinding, for example. During the plating process, the current density at the cathode will preferably be about 40 mA/cm². With this current density and using the above mentioned electrolyte, and with an electrolyte temperature of about 740° C, a niobium layer of about 0.6 um per minute is deposited on the copper body 7. Typically, on a copper body 7 with a thickness of about 20 mm, the deposition will be continued until the niobium layer has reached a thickness of about 2 mm. A typical copper body will be 20 cm wide and about 50 cm long. After plating, the copper body is removed from the electrolyte and allowed to cool under a protective gas. It is then removed from the coating chamber 2 through a lock, not shown in detail on FIG. 1.

Figure 2:
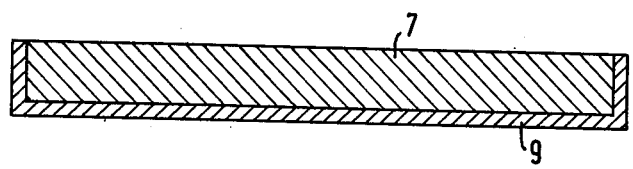
FIG. 2 is a cross sectional view of the body formed by the fusion electrolysis.

The resulting body after plating is shown on FIG. 2. As illustrated thereon, this will comprise the copper body 7 coated with a niobium layer 9 on one wide side and two narrow sides. The copper used for the copper body will preferably be copper which has been electrolytically refined several times. The body shown on FIG. 2 is then cold rolled. Preferably, cold rolling will be accomplished using a number of passes to obtain a finished body having a thickness which will preferably be about 5 % of the thickness before rolling. Preferably, 10 to 15 cold-rolling passes will be used. During this rolling, it is advantageous to guide the ribbon at the lateral edges using guide rollers to prevent a possibly undesirable widening of the ribbon during the rolling. Irregularities at the edges of the ribbon, which might occur during the rolling, can be eliminated by milling over the edges. A typical rolled ribbon such as that shown on FIG. 3 will comprise a copper layer 10, 1 mm thick and a niobium layer 11, about 0.1 mm thick. At the edges of the ribbon, the deposited niobium layer forms the flanges designated as 12 and 13 on FIG. 3. Starting with an original copper body having a width of about 20 cm and a length of about 50 cm, the width of the finished ribbon can advantageously be about 20 cm and have a length of approximately 10 m.

It may be advantageous to subject the ribbon to a heat treatment between the individual rolling passes. The mechanical stresses which are produced by the cold forming will thereby be removed. As an example, the ribbon can be annealed at a temperature of several hundred, preferably about 500 to 700°C, for a period of, for example, 2 hours in a vacuum with a residual gas pressure of $10^{-4}$ Torr or less, or in an inert gas.

Figure 3:
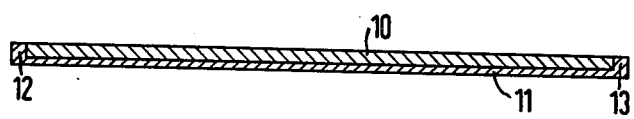
FIG. 3 is a cross sectional view of the ribbon resulting from the cold rolling of the body of FIG. 2.
Figure 4:
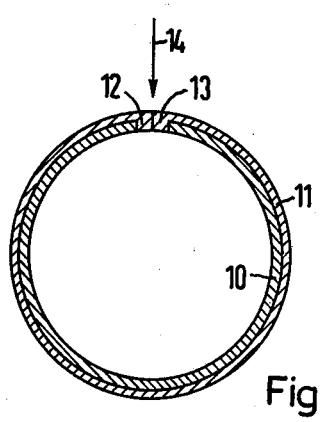
FIG. 4 is a cross sectional view of a tubular conductor fabricated from a ribbon such as the ribbon of FIG. 3, indicating the manner in which the tubular conductor is electron beam welded.

After formation of the ribbon, the tubular conductor is then formed. The ribbon of FIG. 3 is bent in such a manner that the outer edges of the two niobium flanges 12 and 13 lie next to each other as shown in FIG. 4. The ribbon can also be bent into a tube in which the copper layer 10 is on the outside and the niobium layer 11 on the inside. After bending, the niobium flanges 12 and 13 are then joined, preferably through the use of electron beam welding. The electron beam which is directed on the joint between the flanges 12 and 13 is schematically illustrated by the arrow 14. Such electron beam welding can be performed in a vacuum of about $10^{-4}$ Torr with an electron acceleration voltage of about 110 kV and an electron current of about 7.5 mA. Under these conditions, a relative velocity between the electron beam and the tubular conductor will preferably be about 3.0 mm/sec.

Figure 5:
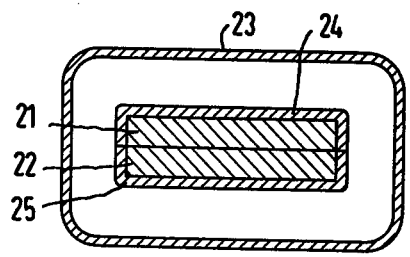
FIG. 5 is a cross sectional view illustrating an alternate embodiment of the invention in which two copper bodies are placed side-by-side inside an electrode which encloses the body.

Another manner of plating is illustrated by FIG. 5. As shown thereon, two copper bodies 21 and 22 are placed together with their wide sides meeting. The two bodies are then placed in the electrolyte bath along with an anode 23 which completely encloses them. Plating is carried out as described above, and because of the complete enclosure of the electrode 23, layers 24 and 25, which completely surround the two copper bodies, will be formed. After the plating process, the two copper bodies are then separated to result in two bodies substantially like that shown on FIG. 2 which may then be further processed in the manner described above. This method has as an advantage, the elimination of any need for working over the unplated side of the copper bodies 21 and 22 which in this process will be completely free from niobium after plating.

The niobium layer deposited on the copper body adheres surprisingly well, both during and after rolling and forms an excellent thermal and electrical contact with the copper. The niobium layer, deposited by fusion electrolysis and rolled in the manner described above, exhibits surprisingly low a-c losses in the superconducting state, thereby making the tubular conductor of the present invention particularly well suited for superconducting a-c cables.

The method of the present invention has the particular advantage over the method disclosed in U.S. Pat. No. 3,777,368, in that it is not necessary to attach the niobium flanges by separate steps. With the method of the present invention, it is furthermore not necessary to plate extremely long copper bodies with niobium in order to fabricate lengths of tubes which are still transportable. Rather, it is possible to make a tube 10 m long, for example, from a plated copper body 50 cm long in accordance with the examples given above. Thus, the plating process is considerably simplified, particularly in regard to the required apparatus. In addition to these advantages, the method of the present invention retains all the advantages of the method described in the aforementioned patent. In particular, it makes possible the manufacture of tubular conductors consisting of niobium and copper in a relatively simple manner and avoids the difficulty which is usually encountered in welding ribbons consisting of a niobium and a copper layer due to the very different melting points of niobium and copper through the use of the niobium flanges which are the only metal portions in contact with each other at the welding seam where they are struck by the electron beam.

Thus, an improved method of forming tubular conductors consisting of a niobium layer and a layer of normally conducting metal has been shown. Although specific methods of carrying out the present invention have been disclosed, it will be obvious to those skilled in the art that various modifications may be made without departing from the spirit of the invention, which is intended to be limited solely by the appended claims.

What is claimed is:

1. An improved method for manufacturing tubular conductors which consist of a niobium layer and a layer of normal conducting metal in which a ribbon consisting of the two layers and having its edges, niobium flanges is first fabricated, after which the ribbon is bent to form a tube so that the niobium flanges at both edges abut, which flanges are then joined together, wherein the improvement comprises the steps of:
   a. plating a copper body using fusion electrolysis to form a niobium layer on one wide and two narrow sides; and
   b. rolling the body so formed to obtain a ribbon to be used in making the tubular conductor.

2. The method according to claim 1 wherein said body is formed into a ribbon by a cold rolling.

3. The method according to claim 1 wherein the step of rolling is carried out in several passes.

4. The method according to claim 2 wherein the rolling is carried out in several passes.

5. The method according to claim 1 wherein said step of plating is accomplished by using a trough shaped electrode which encloses only the sides of the copper body to be plated.

6. The method according to claim 2 wherein said step of plating is accomplished by using a trough shaped electrode which encloses only the sides of the copper body to be plated.

7. The method according to claim 3 wherein said step of plating is accomplished by using a trough shaped electrode which encloses only the sides of the copper body to be plated.

8. The method according to claim 1 wherein the step of plating is carried out by placing two copper bodies on top of each other and plating the two combined bodies on all sides and further including the step of separating the two bodies after plating.

9. The method according to claim 2 wherein the step of plating is carried out by placing two copper bodies on top of each other and plating the two combined bodies on all sides and further including the step of separating the two bodies after plating.

10. The method according to claim 3 wherein the step of plating is carried out by placing two copper bodies on top of each other and plating the two combined bodies on all sides and further including the step of separating the two bodies after plating.

* * * * *